United States Patent
Tange et al.

[11] Patent Number: 5,973,260
[45] Date of Patent: Oct. 26, 1999

[54] CONVERGING TYPE SOLAR CELL ELEMENT

[75] Inventors: Kyoichi Tange, Mishima; Tomonori Nagashima, Susono, both of Japan

[73] Assignee: Toyota Jidosha Kabushiki Kaisha, Japan

[21] Appl. No.: 08/947,103

[22] Filed: Oct. 8, 1997

[30] Foreign Application Priority Data

Oct. 9, 1996 [JP] Japan ................................. 8-268482

[51] Int. Cl.$^6$ ..................... H01L 31/068; H01L 31/042
[52] U.S. Cl. ..................... 136/256; 136/255; 136/259; 136/246; 136/249; 136/252; 257/448; 257/452; 257/457; 257/459; 257/461; 257/463; 257/466; 126/698
[58] Field of Search ..................... 136/255, 256, 136/259, 246, 249 MS, 252; 438/71, 98; 257/61, 448, 452, 457, 459, 461, 463, 466; 126/698

[56] References Cited

U.S. PATENT DOCUMENTS

| | | | |
|---|---|---|---|
| 4,133,698 | 1/1979 | Chiang et al. | 136/255 |
| 5,053,083 | 10/1991 | Sinton | 136/256 |
| 5,641,362 | 6/1997 | Meier | 136/256 |

OTHER PUBLICATIONS

Lammert et al., IEEE Transactions on Electron Devices, ED–24, No. 4, Apr. 1997.

*Primary Examiner*—Alan Diamond
*Attorney, Agent, or Firm*—Finnegan, Henderson, Farabow, Garrett, & Dunner, LLP

[57] ABSTRACT

The present invention discloses a converging type solar cell element able to restrain recombination of carriers and inflow of carriers into an embankment section and improve photoelectric conversion efficiency. A p$^+$ diffusion layer 16 is formed on the surface of a sunlight receiving section 10 which is formed on a silicon substrate 12 comprising a p-type silicon. An energy gradient arises between the p$^+$ diffusion layer 16 and the silicon substrate 12. Therefore, free electrons, which are minority carriers among the carriers generated in the silicon substrate 12 resulting from irradiation of sunlight to the sunlight receiving section 10, can be prevented from migrating to the surface side of the silicon substrate 12. Further, recombination of free electrons which may arise due to lattice defects of the surface can also be prevented. Still further, the p$^+$ diffusion layer 16 may also be formed on a back surface side of the embankment section 14 which surrounds the sunlight receiving section 10. Due to operation of the aforementioned energy gradient, inflow of the free electrons, which are minority carriers, into the embankment section can be prevented.

6 Claims, 5 Drawing Sheets

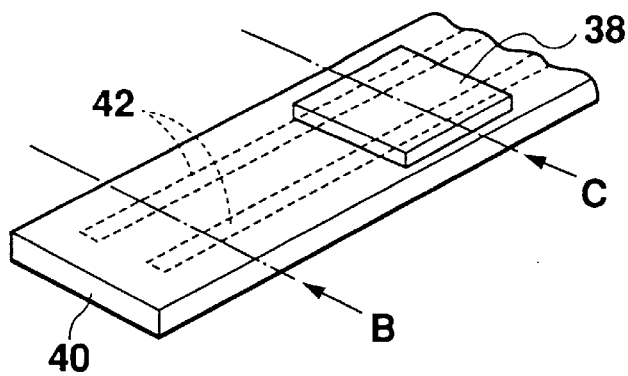
Fig. 4(a)
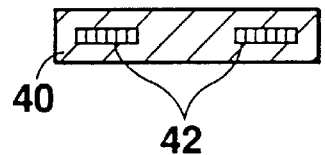
Fig. 4(b)
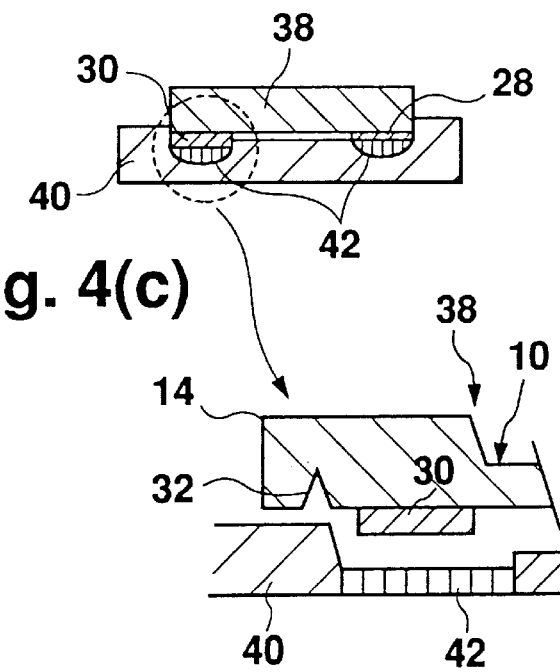
Fig. 4(c)
Fig. 4(d)

CONVERGING TYPE SOLAR CELL ELEMENT

BACKGROUND OF THE INVENTION

1. Field of the Invention

The present invention relates to an improved converging type solar cell element, especially to one in which electrodes are formed on the back of a silicon substrate.

2. Description of the Related Art

Solar cells are used for various purposes. For the purpose of achieving a reduction in costs of a power generation system utilizing solar cells, various converging type solar cell modules that decrease an application area of expensive solar cells by converging sunlight using a lens have been originated. Also, various sun tracking systems have been conceived for the purposes of improving efficiency of power generation of converging type solar cell modules.

Such converging type solar cell modules use a converging type solar cell element in which solar cells are formed and electrodes for transferring current are provided. When a converging spot formed by convergence of sunlight is irradiated to a sunlight receiving section of the converging type solar cell element, free electrons and positive holes are generated as carriers in the silicon substrate. These carriers are separated by p-n junction, and the free electrons are then taken out as current from electrodes via an n-layer, with positive holes current supplied via a p-layer.

The converging type solar cell element mentioned above is thin, with a thickness normally within the range of 50 to 150 μm. Due to this thickness, the element is occasionally damaged during mounting work or the like. Therefore, in order to improve the yield, enhanced strength is desired. Under the circumstances, as shown in FIG. 5, it is necessary to provide an embankment section 14 around a sunlight receiving section 10 of the converging type solar cell element for the purposes of reinforcement.

However, the conventional converging type solar cell element mentioned above has such a problem that some of the generated current flows into the embankment section 14 thereby decreasing the quantity of current which can be collected, and thereby lowering photoelectric conversion efficiency. The aforementioned problem can be controlled by reducing a width d of the embankment section 14 shown in FIG. 5. However, when the width of the embankment section 14 is set to 1 mm, a carrier loss of approximately 8 to 10 percent arises, whereas, even when the width is set to 0.3 mm, the loss is 3 to 5 percent.

Also, a bus electrode for collecting current which is taken out from the electrodes is provided on the back side of the embankment section 14 shown in FIG. 5. If the width d of the embankment section 14 is reduced, the area of the bus electrode will become smaller. This causes such a problem that internal resistance of the converging type solar cell element increases.

type solar cell element which is capable of restraining the recombination of carriers and the inflow of carriers into the embankment section and improving photoelectric conversion efficiency.

For the purposes of achieving the object described above, according to a first aspect of the present invention, the converging type solar cell element is composed of crystal silicon and is a back electrode type in which electrodes are formed on the back of a sunlight receiving section, while on the surface of the sunlight receiving section, a $p^+$ layer or an $n^+$ layer, each of which has a impurity concentration 10 to 100 times as much as that of a silicon substrate used, is formed.

Further, according to a second aspect of the present invention, in the converging type solar cell element of the first aspect, a texture having a pyramidal uneven surface is formed on the surface of the sunlight receiving section.

Further, according to a third aspect of the present invention, in the converging type solar cell element of the first aspect, a $p^+$ diffusion layer or an $n^+$ diffusion layer is formed in the form of either a line or a dot.

Further, according to a fourth aspect of the present invention, the converging type solar cell element is composed of crystal silicon and is a back electrode type in which electrodes are formed on the back of a sunlight receiving section, and an embankment section for reinforcement is formed around the sunlight receiving section. Also, at least on either surface of the sunlight receiving section or the back of the embankment section, a $p^+$ diffusion layer or an $n^+$ diffusion layer is formed having an impurity concentration 10 to 100 times as much as that of a silicon substrate used,.

Further, according to a fifth aspect of the present invention, the converging type solar cell element is composed of crystal silicon and is a back electrode type in which electrodes are formed on the back of a sunlight receiving section, and an embankment section for reinforcement is formed around the sunlight receiving section. Also, a groove is formed on the back of the embankment section in such a manner that the groove surrounds the sunlight receiving section.

Further, according to a sixth aspect of the present invention, in the converging type solar cell element of the fifth aspect, the depth of the groove is nearly equal to the thickness of the sunlight receiving section.

Further, according to a seventh aspect of the present invention, in the converging type solar cell element of the fifth aspect, a distance between the groove and the sunlight receiving section is 100 μm or less.

Further, according to an eighth aspect of the present invention, in the converging type solar cell element of the fifth aspect, a $p^+$ diffusion layer or an $n^+$ diffusion layer is formed at the groove's side surface on the side of enclosing the sunlight receiving section.

Further, according to a ninth aspect of the present invention, in the converging type solar cell element of the FIG. 3 shows an example of the bus electrode shown in FIG. 2.

FIGS. 4 (a), (b), (c), and (d) respectively show another embodiment of the converging type solar cell element according to the present invention.

DESCRIPTION OF THE PREFERRED EMBODIMENTS

Preferred embodiments of the present invention will be subsequently described with reference to the attached drawings.

Figure 1:
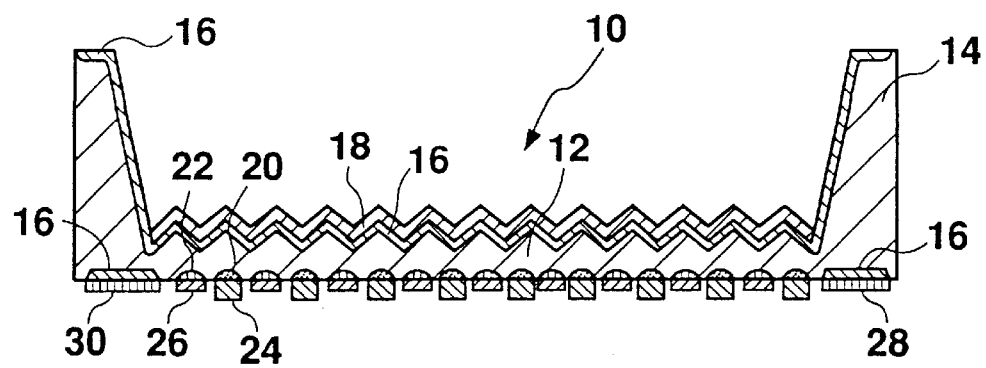

In FIG. 1, a sectional view of an embodiment of a converging type solar cell element according to the present invention is shown. In FIG. 1, a sunlight receiving section 10 is formed by etching a silicon (Si) substrate 12, and an embankment section 14 for reinforcement is provided around the sunlight receiving section 10. Either a p-type silicon or an n-type silicon can be used as the silicon substrate 12, but the p-type silicon which has a longer career life is generally used. The sunlight receiving section 10 is formed by etching the silicon substrate 12 which is approximately 300 to 700 $\mu$m in thickness. On a surface of the sunlight receiving section 10, a texture having a pyramidal uneven surface is formed by fine processing. On the surface of the sunlight receiving section which the texture is formed, a $p^+$ diffusion layer 16 is formed continuously from the embankment section 14. For the sunlight receiving section 10, an antireflection film 18 is further formed on the upper part of the $p^+$ diffusion layer 16.

This embodiment shows an example in which p-type silicon is used as the silicon substrate 12. However, if n-type silicon is used, the $n^+$ diffusion layer will be used as a substitute for the $p^+$ diffusion layer 16. In a case of the $p^+$ diffusion layer 16, boron is used as an impurity, whereas for the $n^+$ diffusion layer, phosphorus is used. A concentration of these impurities is 10 to 100 times as much as that of the silicon substrate 12 used.

$p^+$ layers 20 and $n^+$ layers 22 are alternately lined on the reverse side of the sunlight receiving section 10. Among the carriers which are generated in the substrate 12 by irradiating to the sunlight receiving section 10 the converging spot formed due to the convergence of sunlight, the positive holes are gathered in the $p^+$ layers 20 and the free electrons are gathered in the $n^+$ layers 22, respectively. A positive electrode 24 is connected to the $p^+$ layers 20 and a negative electrode 26 is connected to the $n^+$ layers 22. Current generated by the sunlight power generation is taken out from these positive electrode 24 and negative electrode 26. The current taken out is gathered by means of a positive bus electrode 28 and a negative bus electrode 30.

As shown in FIG. 1, the bus electrodes 28 and 30 are provided on the back side of the embankment section 14. Also, at the positions on the back side of the embankment 14 which are opposite to the bus electrodes 28 and 30, the $p^+$ diffusion layer is formed similarly to the surface of the sunlight receiving section 10. Even in this case, the $n^+$ diffusion layer will be formed instead of the $p^+$ diffusion layer 16 if the n-type silicon is used as the silicon substrate 12.

When the $p^+$ diffusion layer 16 is provided on the surface of the sunlight receiving section 10, free electrons, which are minority carriers among the carriers generated in the silicon substrate 12 due to the irradiation of sunlight to the sunlight receiving section 10, do not migrate to the surface side of the silicon substrate 12 as energy of the $p^+$ diffusion layer 16 is higher than that of the silicon substrate 12. Consequently, recombination of carriers which may arise due to lattice defects of the surface of the silicon substrate 12 is prevented and consumption of free electrons can be restrained. It is proven that the effect will be more remarkable if a texture having a pyramidal uneven surface as shown in FIG. 1 is formed on the surface of the silicon substrate 12. In a case that no texture was formed, an output of the converging type solar cell element at the time of forming the $p^+$ diffusion layer 16 increased by approximately two to three percent as compared with a case that there was no $p^+$ diffusion layer 16. However, in a case that texture was formed, the output increased by five to eight percent.

Also, in a case that the $p^+$ diffusion layer 16 is formed on the back of the embankment section 14, free electrons, namely minority carriers among the carriers which flow into the embankment section 14, return to the back of the sunlight receiving section 10 again due to an energy gradient similar to the one described above. Then, the free electrons are taken in by the $n^+$ layer 22 and taken out from the negative electrode 26. Therefore, it is possible to effectively withdraw the free electrons which flow into the embankment section 14.

By forming the $p^+$ diffusion layer 16 on the surface of the sunlight receiving section 10 or the back of the embankment section 14 as described above, disappearance of free electrons due to the recombination of carriers or consumption of free electrons due to the inflow of free electrons into the embankment section 14 can be prevented. This enables improvement of photoelectric conversion efficiency. The effect mentioned above can be obtained by forming the $p^+$ diffusion layer 16 at least on either the surface of the sunlight receiving section 10 or the back of the embankment section 14. However, it is most preferable to form the $p^+$ diffusion layer on both surfaces.

A sufficient amount of positive holes, which are majority carriers when the p-type silicon is used as the silicon substrate 12, exist in the silicon substrate 12. Therefore, problems of the disappearance and consumption of carriers described above can be ignored. On the other hand, when the n-type silicon is used as the silicon substrate 12, the positive holes become minority carriers. Therefore, in contrast with the above case, diffusion layers to be formed on the surface of the sunlight receiving section 10 and the back surface of the embankment section 14 are $n^+$ diffusion layers.

Figure 6:
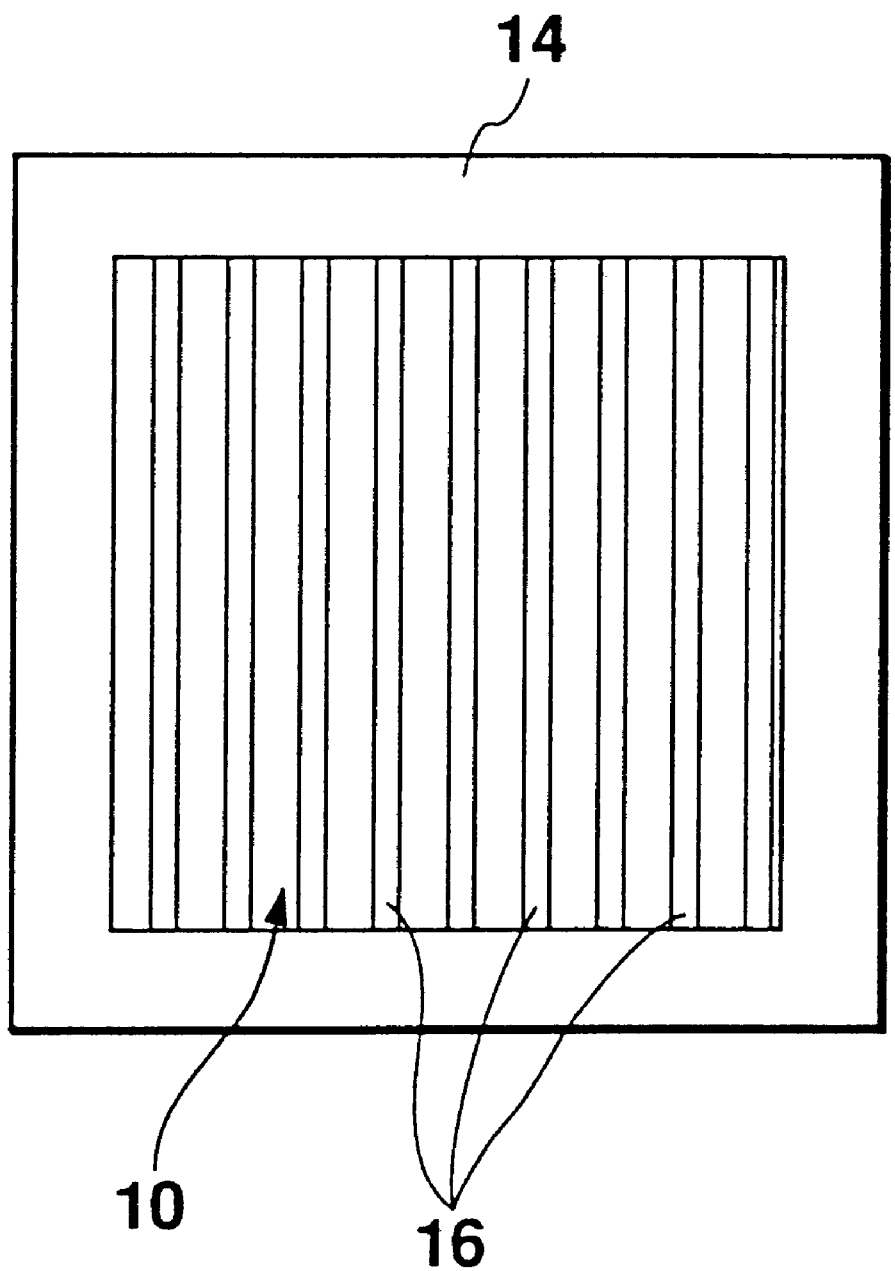
FIG. 6 shows an example of deformation of the $p^+$ diffusion layer shown in FIG. 1.
Figure 7:
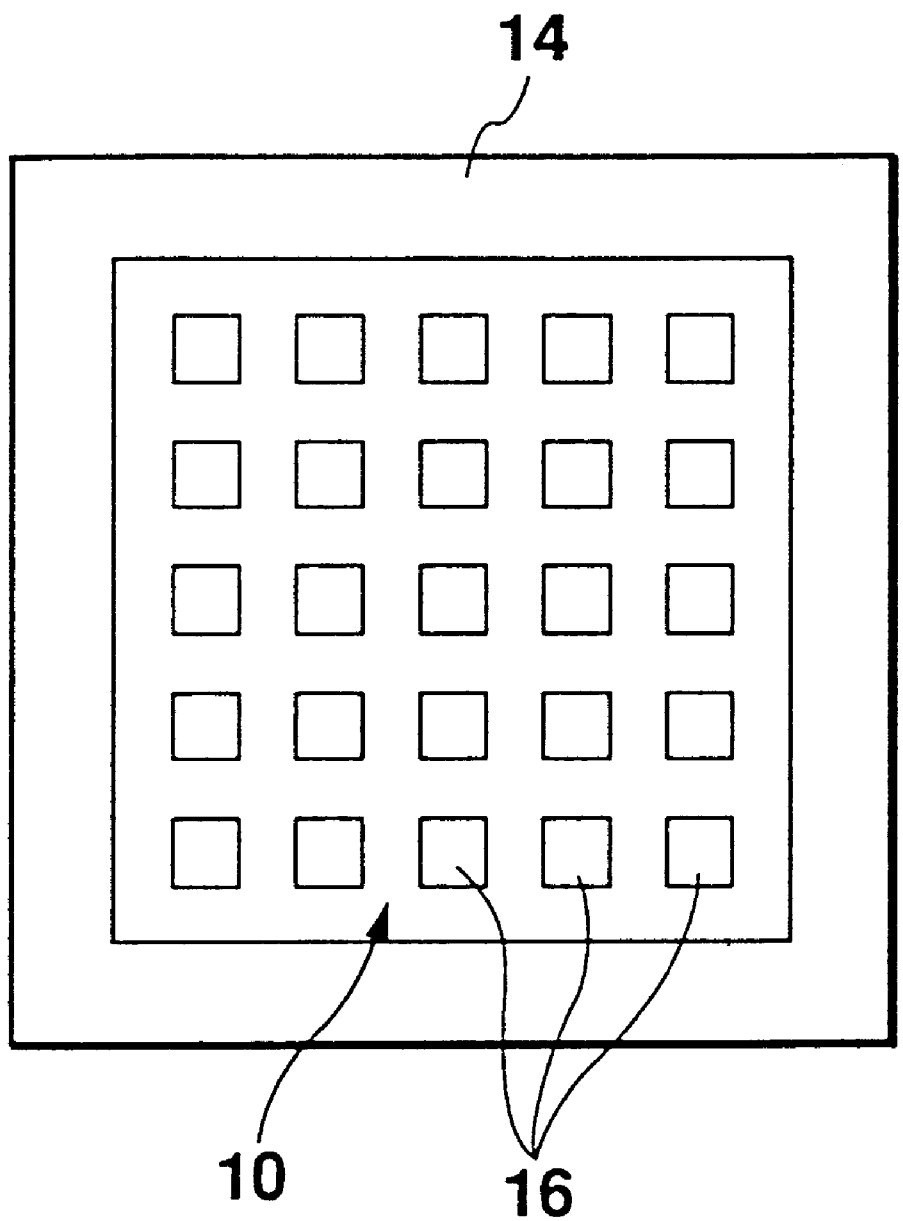
FIG. 7 shows another example of the $p^+$ diffusion layer shown in FIG. 1.

Also, the $p^+$ diffusion layers 16 to be formed on the surface of the sunlight receiving section 10 need not be formed on the entire surface of the sunlight receiving section 10. It is sufficient that they are formed on the surface in the form of a line with a width of 10 to 20 $\mu$m and a pitch of 20 to 100 $\mu$m as shown in FIG. 6 or in the form of dot with a side length of 5 to 100 $\mu$m and a pitch of 50 to 500 $\mu$m as shown in FIG. 7. Thus, in comparison to the case that the $p^+$ diffusion layers 16 are formed on the entire surface of the sunlight receiving section 10, the amount of the carriers, namely, the amount of the free electrons which may disappear in the $p^+$ diffusion layers 16 due to Auger recombination, is decreased. Consequently, it more effectively improves photoelectric conversion efficiency.

An oxide film for insulation purpose is omitted in FIG. 1, but it is actually formed between the back of the silicon substrate 12 and the positive electrode 24, negative electrode 26, bus electrode 28, and bus electrode 30.

Figure 2:
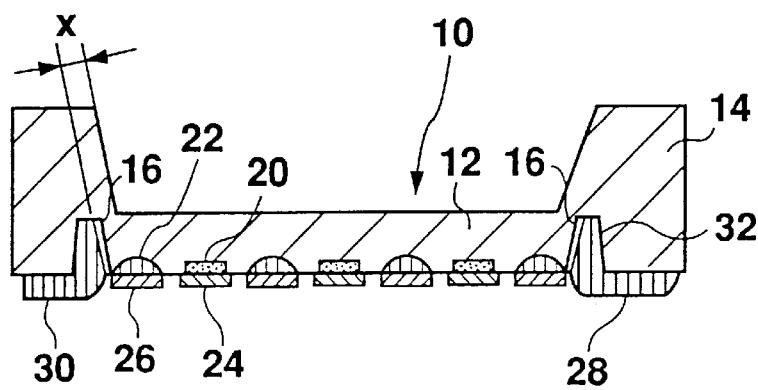

FIG. 2 shows a sectional view of another embodiment of the converging type solar cell element according to the present invention. With regard to the elements the same as those already explained for FIG. 1, the identical numbers are attached and their explanation is omitted.

FIG. 2 is characterized in that a groove 32 is provided on the back of the embankment section 14. This groove is formed in such a manner that it surrounds the sunlight receiving section 10. The depth of the groove 32 is almost equal to the thickness of the silicon substrate 12 in the sunlight receiving section 10. Also, a distance X between the groove 32 and the sunlight receiving section 10 shown in FIG. 2 is 100 μm or less.

As described above, by forming the groove 32 on the back side of the embankment section 14, the flowing out of carriers generated in the silicon substrate 12 to the embankment section 14 side can be prevented. Therefore, photoelectric conversion efficiency of the converging type solar cell element can be improved. This is because a path for the carriers is made between the groove 32 and a side surface of the embankment 14 which surrounds the sunlight receiving section 10 by forming the groove 32 and an outflow of the carriers to the embankment section 14 side can be prevented. Due to formation of the aforementioned groove 32, an output of the converging type solar cell element can be increased by 10 to 15 percent.

It is also preferable to form the $p^+$ diffusion layer 16 on the side surface of groove 32 which is on the side of enclosing the sunlight receiving section 10. By doing so, energy gradient arises as given in the description of FIG. 1. This makes it possible to more efficiently transfer the carriers (free electrons), which flew into the embankment section, to the $n^+$ layer 22 on the back side of the sunlight receiving section 10. Similarly to the case in FIG. 1, the $p^+$ diffusion layer 16 is applied when the p-type silicon is used as the silicon substrate 12 as it is in this case, and the $n^+$ diffusion layer is applied when the n-type silicon is used.

Figure 3:
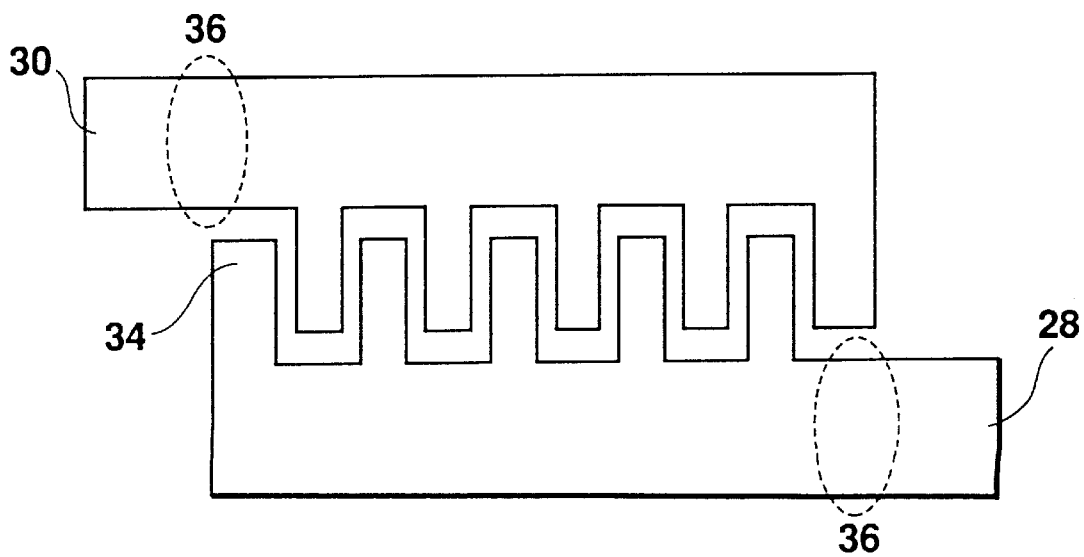
Figure 5:
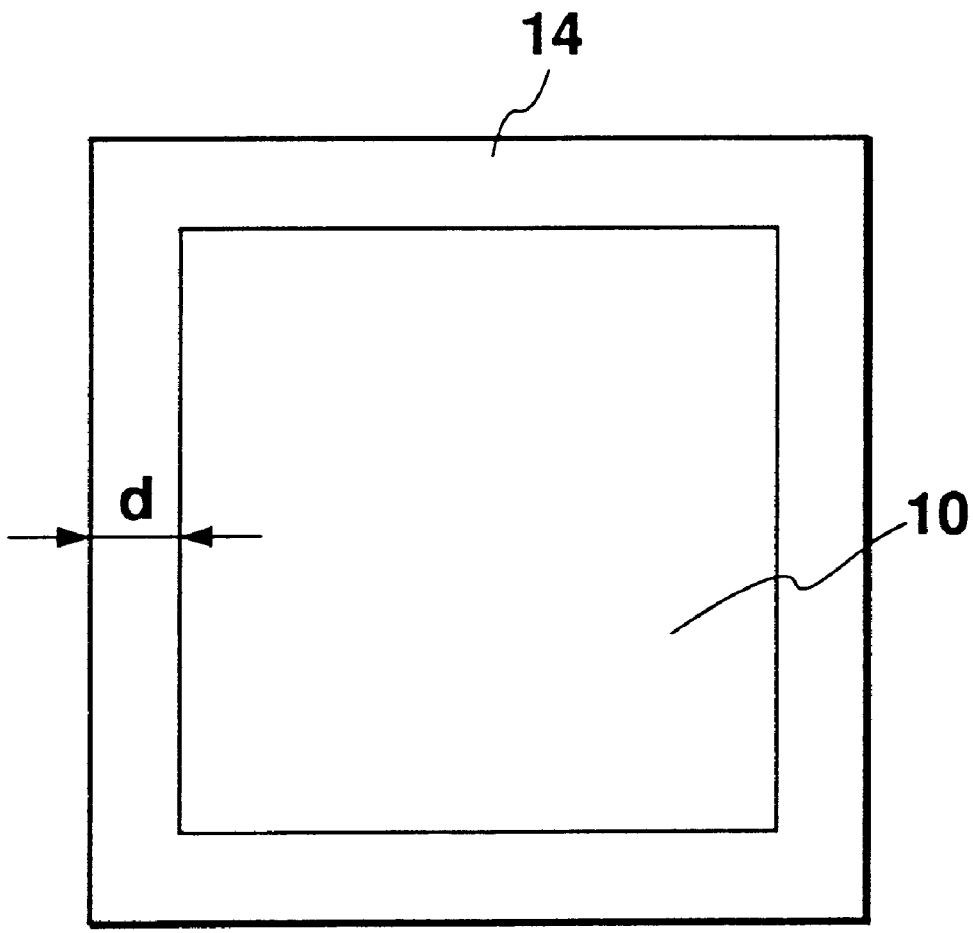
FIG. 5 shows the constitution of a conventional embankment section.

On the back side of the embankment section, the positive bus electrode 28 and the negative electrode 30 are formed. These bus electrodes 28 and 30 extend to the inside of the aforementioned groove 32. As shown in FIG. 3, these are comb-shaped electrodes and engage each other on the back side of the sunlight receiving section 10. The positive electrode 24 and the negative electrode 26 are respectively in contact with the top of a projection 34 which is equivalent to the tooth of a comb. Current is drawn from their respective contact points. Due to such constitution, a large amount of current flow at the root of bus electrode 36. If the sectional area of the root is small, the internal resistance of the converging type solar cell element will increase. Therefore, if the bus electrodes 28 and 30 are formed in such a manner that they extend to the inside of the groove 32, the sectional area will be large, thereby preventing the increase of internal resistance.

FIG. 4 shows another embodiment of the converging type solar cell element according to the present invention. In FIG. 4a, a cut-away view of this embodiment is illustrated. In this embodiment, the converging type solar cell element 38 and a bus film 40 which takes out current from the converging type solar cell element 38 are individually constituted. Electrically conductive ribbons 42 for drawing current from the converging type solar cell element are embedded in the bus film 40.

The section of an arrow B of FIG. 4a is shown in FIG. 4b and the section of an arrow C in FIG. 4c, respectively. As shown in FIG. 4b, in the area where the converging type solar cell element 38 is not installed, the electrically conductive ribbons 42 are embedded inside the resin bus film 40. By contrast, in the area where the converging type solar cell element is installed, the upper parts of the electrically conductive ribbons 42 are exposed and in contact with the bus electrodes 28 and 30 of the converging type solar cell element 38 as shown in FIG. 4c.

FIG. 4d illustrates an enlarged view of the portion of FIG. 4c enclosed with a dotted circle. In FIG. 4d, the groove 32 is formed at the embankment section 14 of the converging type solar cell element 38 in common with FIG. 2. However, the bus electrodes 28 and 30 are not formed at the groove 32, but to the inside of the groove 32. Contact of these bus electrodes 28 and 30 with the electrically conductive ribbons 42 is made by carrying out the heating and pressure connecting of the embankment section 14 and the bus film 40. At this time, the surface of the resin bus film 40 is melted and flows into the groove 32 in such a manner that it fills the groove 32. Therefore, at this part, the bus electrodes 28 and 30 and the electrically conductive ribbons 42 are sealed up from outside. Due to such constitution, waterproof processing of the bus electrodes 28 and 30 and the electrically conductive ribbons can be performed. Therefore, it is not necessary to perform waterproof processing between the embankment section 14 and the bus film using a sealant.

Heretofore, the converging type solar cell element 38 was directly cooled by refrigerant. The bus electrodes 28 and 30 had to be waterproofed and a space between the embankment section 14 and a substrate on which the converging type solar cell element 38 was installed had to be sealed by means of sealant. Thus, a large space had to be secured for the embankment section 14. However, in this embodiment, the bus electrodes 28 and 30 and the electrically conductive ribbons 42 can be waterproofed due to the constitution described above. Thus, a large space is not required for the embankment section 14, and a space for the sunlight receiving section 10 can be enlarged by the portion saved. This makes it possible to increase the amount of power generation of the converging type solar cell element 38.

As described above, as a $p^+$ diffusion layer or an $n^+$ diffusion layer is provided on the surface of a sunlight receiving section in the present invention, the flowing of carriers generated near the surface onto the top surface of the sunlight receiving section can be prevented. Consequently, the amount of the carriers which disappear due to carriers recombination can be decreased, thereby improving photoelectric conversion efficiency.

Also, a groove is provided on the back side of an embankment section, and therefore outflow of carriers, which are generated in a silicon substrate, to the embankment section can be prevented. This also enables improvement of the photoelectric conversion efficiency.

Further, by extending a bus electrode to the inside of the groove, the sectional area of the bus electrode can be enlarged, thereby decreasing internal resistance.

While there have been described what are at present considered to be preferred embodiments of the invention, it will be understood that various modifications may be made thereto, and it is intended that the appended claims cover all such modifications as fall within the true spirit and scope of the invention.

What is claimed is:

1. A solar cell element for use with a converging lens, wherein the solar cell element has a crystal silicon substrate formed with a sunlight receiving section, an electrode on a back surface of the sunlight receiving section, and comprises a reinforcing embankment section around said sunlight receiving section, and a p$^+$ diffusion layer or an n$^+$ diffusion layer formed on at least one of a surface of said sunlight receiving section and the back surface of said embankment section, wherein either of the p$^+$ diffusion layer or the n$^+$ diffusion layer has an impurity concentration 10 to 100 times as much as that of the crystal silicon substrate.

2. A solar cell element for use with a converging lens, wherein the solar cell element has a crystal silicon substrate formed with a sunlight receiving section, an electrode on a back surface of the sunlight receiving section, and comprises a reinforcing embankment section around said sunlight receiving section, and a groove in a back surface of said embankment sections, said groove surrounding said sunlight receiving section.

3. The solar cell element according to claim 2, wherein said groove has a depth approximately equal to the thickness of said sunlight receiving section.

4. The solar cell element according to claim 2, wherein said groove and said sunlight receiving section are spaced by a distance of 100 µm or less.

5. The solar cell element according to claim 2, wherein a p$^+$ diffusion layer or an n$^+$ diffusion layer is formed on a side surface of said groove closest to said sunlight receiving section.

6. The solar cell element according to claim 2, wherein a bus electrode provided on the back surface of said embankment section extends inside of said groove.

* * * * *